(12) United States Patent
Feldman-Peabody et al.

(10) Patent No.: US 9,054,245 B2
(45) Date of Patent: Jun. 9, 2015

(54) DOPING AN ABSORBER LAYER OF A PHOTOVOLTAIC DEVICE VIA DIFFUSION FROM A WINDOW LAYER

(75) Inventors: Scott Daniel Feldman-Peabody, Golden, CO (US); Robert Dwayne Gossman, Aurora, CO (US)

(73) Assignee: First Solar, Inc., Tempe, AZ (US)

( * ) Notice: Subject to any disclaimer, the term of this patent is extended or adjusted under 35 U.S.C. 154(b) by 130 days.

(21) Appl. No.: 13/410,516

(22) Filed: Mar. 2, 2012

(65) Prior Publication Data

US 2013/0230944 A1 Sep. 5, 2013

(51) Int. Cl.
*H01L 21/00* (2006.01)
*H01L 31/0296* (2006.01)
*H01L 31/073* (2012.01)

(52) U.S. Cl.
CPC ........ *H01L 31/02963* (2013.01); *H01L 31/073* (2013.01); *Y02E 10/543* (2013.01)

(58) Field of Classification Search
CPC .............. H01L 31/1836; H01L 31/073; H01L 31/0296; H01L 31/1828
See application file for complete search history.

(56) References Cited

U.S. PATENT DOCUMENTS

| | | |
|---|---|---|
| 4,950,615 A | 8/1990 | Basol et al. |
| 5,261,968 A | 11/1993 | Jordan |
| 5,372,646 A | 12/1994 | Foote et al. |
| 5,474,939 A | 12/1995 | Pollock et al. |
| 5,922,142 A | 7/1999 | Wu et al. |
| 6,137,048 A | 10/2000 | Wu et al. |
| 6,169,246 B1 | 1/2001 | Wu et al. |
| 6,221,495 B1 | 4/2001 | Wu et al. |
| 6,423,565 B1 | 7/2002 | Barth et al. |
| 6,444,043 B1 | 9/2002 | Gegenwart et al. |
| 6,548,751 B2 | 4/2003 | Sverdrup, Jr. et al. |
| 6,852,614 B1 | 2/2005 | Compaan et al. |
| 6,913,943 B2 | 7/2005 | Cunningham et al. |
| 7,141,863 B1 | 11/2006 | Compaan et al. |
| 7,211,462 B2 | 5/2007 | Romeo et al. |
| 7,522,282 B2 | 4/2009 | Nolte et al. |
| 7,557,053 B2 | 7/2009 | Thomsen et al. |
| 7,659,968 B2 | 2/2010 | Wang et al. |

(Continued)

FOREIGN PATENT DOCUMENTS

| | | |
|---|---|---|
| EP | 2034002 | 3/2009 |
| EP | 2110904 | 10/2009 |

(Continued)

OTHER PUBLICATIONS

Wu, Xuanzhi. "High-efficiency polycrystalline CdTe thin-film solar cells", *Solar Energy* 77, pp. 803-814, 2004.

(Continued)

*Primary Examiner* — Brett Feeney
*Assistant Examiner* — Khanh Duong
(74) *Attorney, Agent, or Firm* — MacMillan, Sobanski & Todd, LLC

(57) ABSTRACT

Methods for doping an absorbent layer of a p-n heterojunction in a thin film photovoltaic device are provided. The method can include depositing a window layer on a transparent substrate, where the window layer includes at least one dopant (e.g., copper). A p-n heterojunction can be formed on the window layer, with the p-n heterojunction including a photovoltaic material (e.g., cadmium telluride) in an absorber layer. The dopant can then be diffused from the window layer into the absorber layer (e.g., via annealing).

19 Claims, 6 Drawing Sheets

(56) References Cited

U.S. PATENT DOCUMENTS

| | | |
|---|---|---|
| 7,663,092 B2 | 2/2010 | Nolte et al. |
| 8,053,350 B2 * | 11/2011 | Feldman-Peabody et al. ............... 438/609 |
| 8,084,682 B2 * | 12/2011 | Chen .............. 136/255 |
| 8,247,683 B2 * | 8/2012 | Frey et al. .............. 136/255 |
| 8,252,618 B2 * | 8/2012 | O'Keefe .............. 438/84 |
| 2004/0063320 A1 | 4/2004 | Hollars |
| 2005/0009228 A1 | 1/2005 | Wu et al. |
| 2007/0209698 A1 | 9/2007 | Thomsen et al. |
| 2008/0096376 A1 | 4/2008 | Li et al. |
| 2009/0165839 A1 | 7/2009 | Zeman et al. |
| 2009/0194165 A1 | 8/2009 | Murphy et al. |
| 2009/0217978 A1 | 9/2009 | Thomsen et al. |
| 2009/0242029 A1 | 10/2009 | Paulson et al. |
| 2011/0005594 A1 | 1/2011 | Powell et al. |
| 2011/0100460 A1 | 5/2011 | Bryden et al. |
| 2011/0269261 A1 | 11/2011 | Drayton et al. |
| 2013/0019948 A1 * | 1/2013 | Feldman-Peabody ........ 136/260 |

FOREIGN PATENT DOCUMENTS

| | | |
|---|---|---|
| JP | 57045288 A2 | 3/1982 |
| WO | 9847702 A1 | 10/1998 |
| WO | 2005117139 A1 | 12/2005 |

OTHER PUBLICATIONS

Gupta, Akhlesh. "Oxygentated CdS Window Layer for Sputtered CdS/CdTe Solar Cells", *MRS Symposium Proceedings*, vol. 763. B8.9.1-B8.9.6, 2003.

* cited by examiner

DOPING AN ABSORBER LAYER OF A PHOTOVOLTAIC DEVICE VIA DIFFUSION FROM A WINDOW LAYER

FIELD OF THE INVENTION

The subject matter disclosed herein relates generally to methods for doping an absorber layer of a photovoltaic device via diffusion from a window layer(s), along with the devices formed therefrom. More particularly, the subject matter disclosed herein relates to copper doping of a cadmium telluride layer of thin film photovoltaic devices, and the devices formed therefrom.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions better compared to the lower bandgap materials and, thus, has a longer effective conversion time over the course of a day or in cloudy conditions as compared to other conventional materials.

The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., an electron accepting layer) and the CdS layer acts as an n-type layer (i.e., an electron donating layer). Free carrier pairs are created by light energy and then separated by the p-n heterojunction to produce an electrical current.

It is generally desired to include at least one dopant (e.g., copper) in the cadmium telluride layer in the final device. For example, copper can be added to the cadmium telluride layer by treating the layer with copper chloride and heating. However, this treatment step adds significant processing requirements to the manufacture of the PV device, since it involves the use of copper chloride, which is a toxic chemical material.

As such, a need exists for methods of doping the absorber layer (e.g., a cadmium telluride layer) while limiting the processing steps required in the manufacturing process and/or avoiding the use of toxic treatments (e.g., copper chloride).

BRIEF DESCRIPTION OF THE INVENTION

Aspects and advantages of the invention will be set forth in part in the following description, or may be obvious from the description, or may be learned through practice of the invention.

Methods are generally provided for doping an absorbent layer of a p-n heterojunction in a thin film photovoltaic device. In one embodiment, the method can include depositing a window layer on a transparent substrate. The window layer can include at least one dopant (e.g., copper). A p-n heterojunction can be formed on the window layer, with the p-n heterojunction including a photovoltaic material (e.g., cadmium telluride) in an absorber layer. The dopant can then be diffused from the window layer into the absorber layer. For example, the dopant can be, in one particular embodiment, diffused into the absorber layer such that the dopant is present in the absorber layer at about 100 ppm to about 1 atomic percent.

Optionally, the p-n heterojunction can further include an n-type window layer positioned between the window layer and the absorber layer. The n-type window layer can include, for instance, cadmium sulfide.

The window layer can define a transparent conductive oxide layer; a resistive transparent buffer layer (e.g., a zinc tin oxide layer) positioned between a transparent conductive oxide layer and the n-type window layer; a getter layer (e.g., positioned adjacent to a transparent conductive oxide layer); etc.

In one particular embodiment, the absorber layer can be substantially free from the dopant prior to diffusing (e.g., the absorber layer can be substantially free from the dopant in its as-deposited state).

Diffusing the dopant from the window layer into the absorber layer can be achieved, in one embodiment, via annealing the absorber layer and the window layer together, such as by heating to an anneal temperature of about 200° C. to about 600° C. (e.g., about 300° C. to about 500° C.).

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
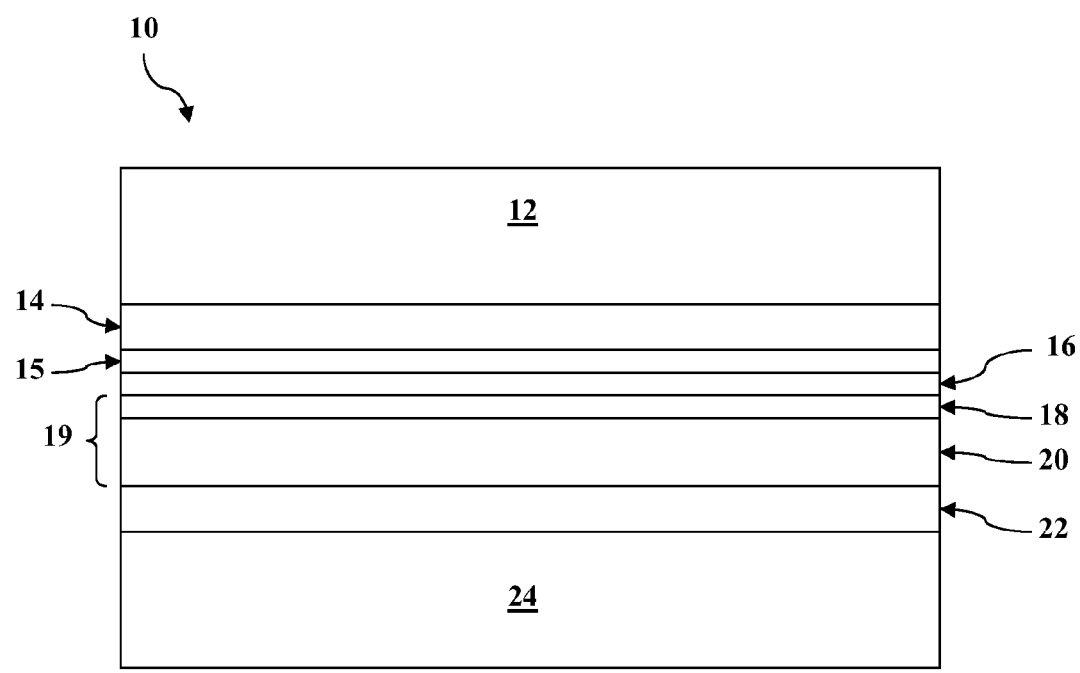
FIG. 1 shows a general schematic of a cross-sectional view of an exemplary cadmium telluride thin film photovoltaic device.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Methods are generally disclosed for forming thin film photovoltaic devices via diffusion of a dopant from a window layer(s) into the absorber layer of the p-n heterjunction and/or the n-type window layer (when present) of the p-n heterjunction. For example, when the absorber layer includes cadmium telluride as the photovoltaic material (i.e., a cadmium telluride layer), copper atoms (as the dopant) can be included in one or more of the window layers and then diffused into the cadmium telluride layer. This diffusion can supplement additional copper treatment of the cadmium telluride layer, or may, in certain embodiments, completely obviate the need for additional copper treatment of the cadmium telluride layer all together. Other dopant materials, such as zinc, manganese, magnesium, chlorine, phosphorous, arsenic, antimony, or mixtures thereof, can also be included in the absorber layer through such diffusion methods, in combination with copper or alternatively thereof.

In one embodiment, diffusion of the dopant can be accomplished via annealing the device (i.e., annealing the window layer(s) and the absorber layer together). Annealing can be accomplished, for instance, via heating to an anneal temperature of about 200° C. to about 600° C., such as about 300° C. to about 500° C.

The dopant can be included in the window layer(s) in any amount capable of achieving the desired dopant concentration in the absorber layer. For example, the dopant can be, in certain embodiments, diffused into the absorber layer such that the dopant becomes present in the absorber layer at about 100 parts per million (ppm) to about 1 atomic percent, such as about 150 ppm to about 0.75 atomic percent.

In one embodiment, at least 75 atomic percent of the dopant included in the window layer(s) can be diffused into the absorber layer, such as about 80 atomic percent to about 95 atomic %.

The window layer that includes the dopant can be any transparent thin film layer in the photovoltaic device that is positioned between the p-n heterjunction (e.g., an absorber layer or the combination of an n-type window layer and an absorber layer) and the transparent substrate. For example, the window layer that includes the dopant can be an index matching layer, a transparent conductive oxide layer, a getter layer (e.g., an oxygen getter layer), and/or a resistive transparent buffer layer; each of which is described in greater detail below. In certain embodiments, the dopant can be included in more than one window layer (e.g., the dopant can be included in at least two window layers). In one particular embodiment, when an n-type window layer is present in the device between the window layer and the absorber layer, the n-type window layer can be substantially free from the dopant (e.g., copper) in its as-deposited state, though it may also become doped with the absorber layer upon diffusing of the dopant.

In one particular embodiment, the window layer that includes the dopant (e.g., an index matching layer, a transparent conductive oxide layer, a getter layer, and/or a resistive transparent buffer layer) can be formed via sputtering of a target, wherein the target comprises the dopant. For example, the target can include both a cadmium tin oxide and the dopant such that the window layer defines a transparent conductive oxide layer that includes the dopant; the target can include both a zinc tin oxide and the dopant such that the window layer defines a resistive transparent buffer layer that includes the dopant; and/or the target can include both a metal and the dopant such that the window layer defines a getter layer that includes the dopant.

Examples of such configurations are discussed below with respect to the drawings. Although shown and described as a cadmium telluride thin film photovoltaic device 10 in FIGS. 1-4 and 6-7, the window layer(s) that includes a dopant can be included in any type of photovoltaic device that uses a doped thin film absorber layer. For example, any suitable photovoltaic material (e.g., monocrystalline silicon, polycrystalline silicon, amorphous silicon, cadmium telluride, and/or copper indium gallium selenide/sulfide) can be present in the absorber layer. Particular embodiments of exemplary cadmium telluride thin film photovoltaic devices 10 are shown in FIGS. 1-4 and 6-7, and are described in greater detail below.

FIG. 1 represents an exemplary cadmium telluride thin film photovoltaic device 10 having a bottom oxygen getter layer 15 positioned between the transparent conductive oxide (TCO) layer 14 and the photovoltaic heterojunction 19 formed from the optional n-type window layer 18 and the absorber layer 20. Generally, the photovoltaic heterojunction 19 can include an optional n-type component (e.g., cadmium sulfide) and a p-type component (e.g., a photovoltaic material, such as cadmium telluride). In one particular embodiment, the p-n heterjunction can be formed by annealing an n-type window layer 18 and a p-type layer 20 together. For example, the n-type window layer 18 can include cadmium sulfide, and the absorber layer 20 can include cadmium telluride. As such, the n-type window layer 18 can be referred to as a cadmium sulfide layer, and the absorber layer 20 can be referred to as a cadmium telluride layer. However, as stated above, the following discussion is not intended to limit the materials of the photovoltaic heterojunction 19, in particular the optional n-type window layer 18 and the absorber layer 20.

Figure 2:
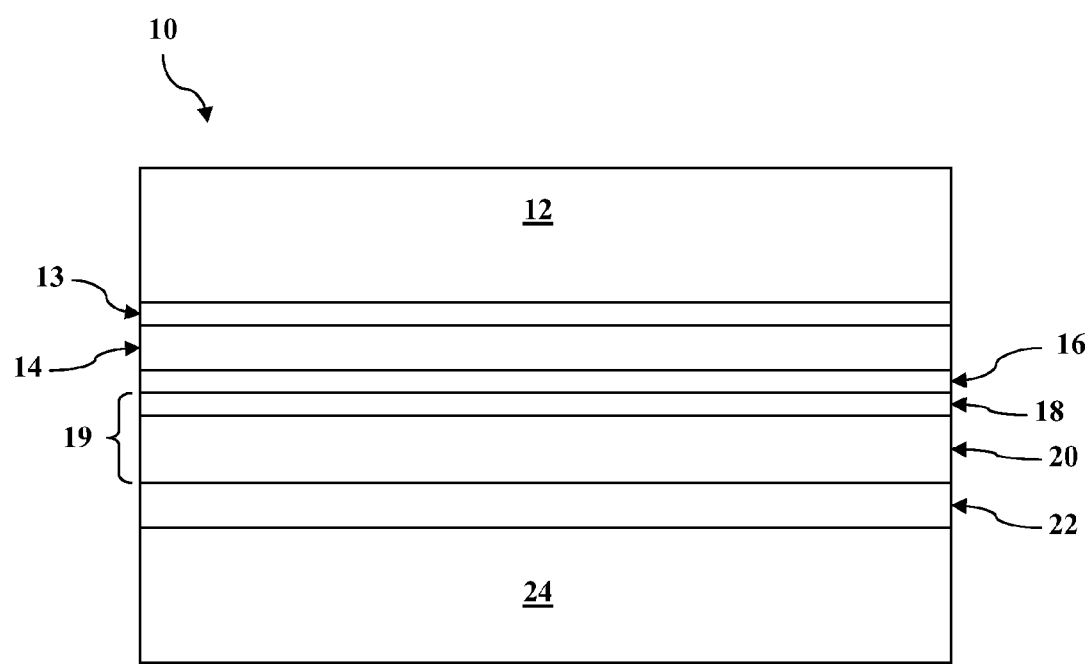
FIG. 2 shows a general schematic of a cross-sectional view of another exemplary cadmium telluride thin film photovoltaic device.

In the embodiment shown, a resistant transparent buffer (RTB) layer 16 is positioned between the TCO layer 14 and the photovoltaic heterojunction 19 (shown as the cadmium sulfide layer 18 and the cadmium telluride layer 20). FIG. 2 shows an alternative embodiment of an exemplary cadmium telluride thin film photovoltaic device 10 having a top oxygen getter layer 13 positioned between the transparent substrate 12 (e.g., a glass substrate) and the TCO layer 14. As stated, the window layer that includes the dopant can be any of the getter layers 13, 15, the transparent conductive oxide layer 14, and/or the resistive transparent buffer layer 16.

The oxygen getter layer(s) 13, 15 are generally configured to be have a greater affinity for oxygen than the TCO material (e.g., be more reactive with oxygen) in order to remove oxygen from the TCO layer 14 during annealing. Specifically, oxygen travels from the TCO layer 14 into the oxygen getter layer(s) 13, 15 during annealing such that the crystallized TCO layer 14 has less oxygen after annealing than as deposited and the annealed oxygen getter layer(s) 13, 15 (i.e., oxygenated oxygen getter layer) has more oxygen after annealing than as deposited. Without wishing to be bound by any particular theory, it is believed that the movement of oxygen from the TCO layer 14 into the oxygen getter layer(s) 13, 15 during annealing can promote oxygen vacancies in the TCO layer 14, which can lead to high carrier concentration. Thus, the crystallized TCO layer 14 formed after annealing can have high conductivity (e.g., greater than about 5500 S-cm).

Figure 3:
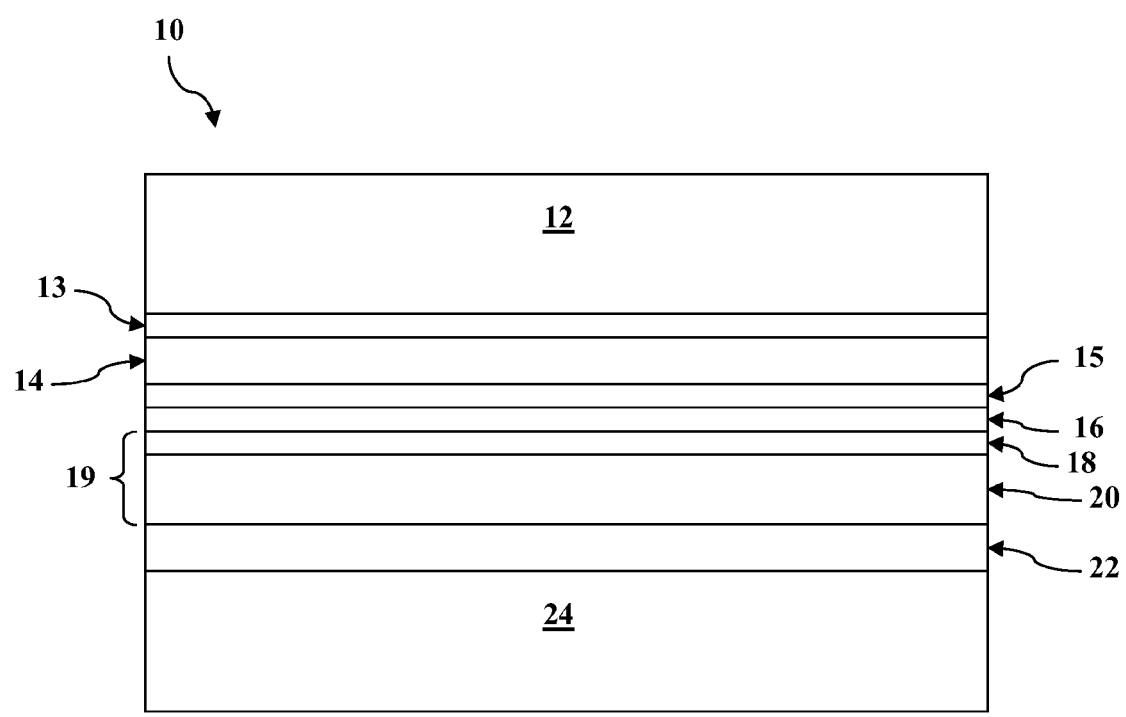
FIG. 3 shows a general schematic of a cross-sectional view of an alternative exemplary cadmium telluride thin film photovoltaic device including a pair of oxygen getter layers.

FIG. 3 shows another exemplary cadmium telluride thin film photovoltaic device 10 having two oxygen getter layers: a top oxygen getter layer 13 positioned between the glass substrate 12 and the TCO layer 14 and a bottom oxygen getter layer 15 positioned between the TCO layer 14 and the photovoltaic heterojunction formed from the cadmium sulfide layer 18 and the cadmium telluride layer 20. In this embodiment, the top oxygen getter layer 13 and the bottom oxygen getter layer 15 can be formed from the same material(s) or different material(s).

In the embodiments shown, the top oxygen getter layer 13 and the bottom oxygen getter layer 15 are in direct contact with the TCO layer 14 to maximize oxygen movement from the deposited TCO layer 14 into the top oxygen getter layer 13 and/or bottom oxygen getter layer 15 during annealing.

The oxygen getter layer(s), including the top oxygen getter layer 13 and/or the bottom oxygen getter layer 15, can be deposited as a material that has a greater affinity for oxygen than the TCO layer 14. For example, the oxygen getter layer(s) can be a relatively thin metal layer, such as having a thickness of about 5 nm to about 40 nm (e.g., about 10 nm to about 25 nm). The metal of the oxygen getter layer(s) in this embodiment can include, for example, tin, zinc, titanium, zirconium, vanadium, aluminum, indium, magnesium, tantalum, niobium, or alloys or mixtures thereof. In particular embodiments, the oxygen getter layer can include tin, titanium, aluminum, or mixtures thereof. In other particular embodiments, the oxygen getter layer can include zinc, cadmium, or mixtures thereof. For instance, the oxygen getter layer(s) include, in one embodiment, a zinc thin film layer having a thickness of about 15 nm to about 25 nm (e.g., about 20 nm).

For example, in embodiments where the dopant is included within the top oxygen getter layer 13 and/or the bottom oxygen getter layer 15, the dopant can be present in the top oxygen getter layer 13 and/or the bottom oxygen getter layer 15 in addition to the metal. In such embodiments, the dopant can have a concentration of about 0.001 atomic % to about 1 atomic %, as deposited, in the top oxygen getter layer 13 and/or the bottom oxygen getter layer 15.

In one particular embodiment, the oxygen getter layer(s) can be substantially free from oxygen when deposited (i.e., prior to annealing). As used herein, the term "substantially free" means no more than an insignificant trace amount present and encompasses completely free (e.g., 0 molar % up to 0.01 molar %). However, in other embodiments, the oxygen getter layer(s) can be deposited as a partially oxidized film.

Depositing the oxygen getter layer(s) can be achieved through any suitable process, including but not limited to, sputtering, chemical vapor deposition, spray pyrolysis, or any other suitable deposition method. In one particular embodiment, when the oxygen getter layer(s) is deposited to be substantially free from oxygen, the oxygen getter layer(s) can be sputtered from a metal target in an inert atmosphere (e.g., argon). In this embodiment, the metal target and/or the inert atmosphere can be substantially free from oxygen. For instance, the sputtering target can include the metal of the top oxygen getter layer 13 and/or the bottom oxygen getter layer 15 and the dopant at the concentration to be found in the as-deposited layer.

Such oxygen getter layer(s) can be particularly useful in conjunction with a TCO layer 14 having a thickness in the range of about 200 nm to about 500 nm, such as about 275 nm to about 325 nm, and/or when the TCO layer 14 includes cadmium stannate (e.g., consisting essentially of cadmium stannate) when deposited. Generally, the TCO layer 14 is shown on the glass substrate 12 of the exemplary device 10, either directly as shown in FIG. 1 or with an intermediate layer (e.g., the top oxygen getter layer 13) therebetween as shown in FIGS. 2 and 3. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, indium tin oxide, zinc stannate, cadmium stannate, cadmium oxide, or mixtures thereof. Additionally, the TCO layer 14 can include other conductive, transparent materials. The TCO layer 14 can also include dopants (e.g., fluorine, tin, etc.) and other materials, as desired.

For example, in embodiments where the dopant is included within the TCO layer 14, the dopant can be present in addition to the at least one conductive oxide. In such embodiments, the dopant can have a concentration of about 0.0001 atomic % to about 0.1 atomic %, as deposited, in the TCO layer 14.

The TCO layer 14 can be formed by sputtering, chemical vapor deposition, spray pyrolysis, or any other suitable deposition method. In one particular embodiment, the TCO layer 14 can be formed by sputtering (e.g., DC sputtering or RF sputtering) on the glass substrate 12. For example, a cadmium stannate layer can be formed by sputtering a hot-pressed target containing stoichiometric amounts of $SnO_2$ and CdO onto the glass substrate 12 in a ratio of about 1 to about 2. The cadmium stannate can alternatively be prepared by using cadmium acetate and tin (II) chloride precursors by spray pyrolysis. In certain embodiments, the TCO layer 14 can have a thickness between about 0.1 μm and about 1 μm, for example from about 0.1 μm to about 0.5 μm, such as from about 0.25 μm to about 0.35 μm.

For instance, the sputtering target can include the metal oxide(s) (e.g., $SnO_2$ and CdO) of the TCO layer 14 and the dopant at the concentration to be found in the as-deposited TCO layer 14.

Once deposited, the TCO layer 14 and the oxygen getter layer(s) (e.g., the top oxygen getter layer 13 and/or the bottom oxygen getter layer 15) can be annealed together via heating to an anneal temperature. For example, the anneal temperature can be about 580° C. to about 680° C. At temperatures higher than this range, the glass may begin to melt; while at temperatures below this range, the anneal time required may be too long for efficient manufacturing processes. For example, the TCO layer 14 and the oxygen getter layer(s) can be annealed at the anneal temperature for a time sufficient to transfer at least some amount of oxygen from the TCO layer 14 into the top oxygen getter layer 13 and/or the bottom oxygen getter layer 15, such as for about 2 minutes to about 1 hour. Annealing causes the TCO layer 14 to become crystallized (i.e., a crystallized TCO layer 14) and the top oxygen getter layer 13 and/or the bottom oxygen getter layer 15 to become oxidized.

For example, the TCO layer 14 can reduce its oxygen content during the annealing by about 5 molar % to about 50 molar % (e.g., about 10 molar % to about 40 molar %) depending on its composition. Likewise, the oxygen getter layer 13 can increase its oxygen content during annealing to become substantially fully oxidized from its deposited state (e.g., Sn can be oxidized to $SnO_2$, Al can be oxidized to $Al_2O_3$, Ti can be oxidized to $TiO_2$, Zr can be oxidized to $ZrO_2$, Zn can be oxidized to ZnO, etc.).

In one particular embodiment, the transparent conductive oxide layer and the oxygen getter layer can be annealed together in an annealing atmosphere that is substantially free from oxygen.

As stated, the TCO layer 14 and the top oxygen getter layer 13 and/or the bottom oxygen getter layer 15 can have their as-deposited stoichiometry and structure until the layers are collectively annealed together (i.e., simultaneously). However, after annealing, the TCO layer 14 has less oxygen present than as deposited while the oxygen getter layer(s) (e.g., the top oxygen getter layer 13 and/or the bottom oxygen getter layer 15) has more oxygen present than as deposited.

Figure 4:
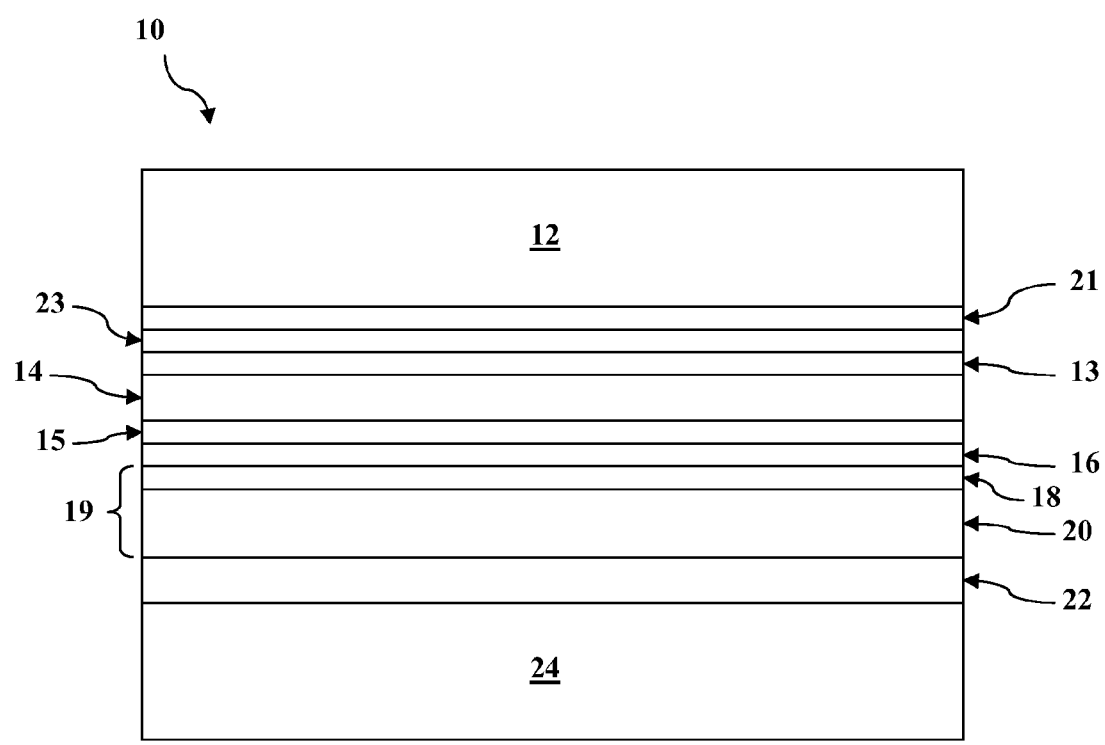
FIG. 4 shows a general schematic of a cross-sectional view of an alternative exemplary cadmium telluride thin film photovoltaic device including two pairs of index matching layers and a pair of oxygen getter layers.

FIG. 4 shows the inclusion of a pair of index matching layers in the form of a high index layer 21 and a low index layer 23 between the TCO layer 14 and the glass substrate 12. The index matching layers can help reduce reflective loss of light entering the device. Thus, the index matching layers can minimize the amount of reflective losses, leading to maximizing the amount of current that can be generated from the device. Additionally, the index matching layers can generally even out color variations seen on the glass face of the photovoltaic module during use. The index matching layers may also further serve as diffusion barriers for contaminants coming from or through the glass substrate into the underlying thin film layers.

The refractive index (sometimes referred to as the index of refraction) of a substance is a measure of the speed of light in that substance, expressed as a ratio of the speed of light in vacuum relative to that in the considered medium. A simple mathematical description of the refractive index (n) is as follows:

$n$=velocity of light in a vacuum/velocity of light in medium.

As light exits the medium, it may also change its propagation direction in proportion to the refractive index (see Snell's law). By measuring the angle of incidence and angle of refraction of the light beam, the refractive index (n) can be determined. The refractive index of materials varies with the frequency of radiated light, resulting in a slightly different refractive index for each color. Unless otherwise stated, the values of refractive indices are calculated at a wavelength of 632 nanometers (nm). Such calculations are routinely performed in the art and methods of conducting them are readily known. One typical method of measuring these films is through the use of ellipsometry or spectroscopic ellipsometry (both techniques may include the use of multiple angles of incident light). For both techniques, the change in phase and polarization of a reference beam of light may be used to fit a model from which can be extracted the refractive index of the material.

In most embodiments, the TCO layer 14 can have a refractive index of about 1.8 to about 2.2 (e.g., about 1.9 to about 2), as can the RTB layer 16, depending on the materials used to form these layers. The cadmium sulfide layer 18 can have a refractive index of about 2.3 to about 2.5 (e.g., about 2.4), and the cadmium telluride layer 20 can have a refractive index of about 2.9 to about 3.1 (e.g., about 3.0). The glass substrate 12 can have a refractive index of about 1.4 to about 1.6 (e.g., about 1.5).

The high index layer 21 generally has a refractive index of about 2.0 or greater (e.g., about 2.0 to about 2.5). In certain embodiments, the high index layer 21 can have a refractive index of about 2.05 to about 2.4, such as about 2.1 to about 2.3. In certain embodiments, the high index layer 21 can be a thin film layer including, but not limited to, titanium dioxide ($TiO_2$), tin oxide, zinc oxide, zinc tin oxide (ZTO), indium oxide ($In_2O_3$), hafnium oxide ($HfO_2$), tantalum pentoxide ($Ta_2O_5$), niobium oxide ($Nb_2O_5$), zirconium oxide ($ZrO_2$), yttrium oxide ($Y_2O_3$), ytterbium oxide ($Yb_2O_3$), silicon nitride ($Si_3N_4$), aluminum nitride (AlN), or mixtures thereof. Other materials may also be included in the high index layer 11, such as dopants, impurities, etc.

The low index layer 23 generally has a refractive index of about 1.5 or less (e.g., about 1.1 to about 1.5). In certain embodiments, the low index layer 23 can have a refractive index of about 1.15 to about 1.4, such as about 1.1 to about 1.3. In certain embodiments, the low index layer 23 can be a thin film layer including, but not limited to, silicon dioxide ($SiO_2$), magnesium fluoride ($MgF_2$), lithium fluoride (LiF), calcium fluoride ($CaF_2$), sodium fluoride (NaF), other group I or group II fluorides, or mixtures thereof. Other materials may also be included in the low index layer 23, such as dopants, impurities, etc. For example, in embodiments where the dopant is included within the high index layer 21 and/or the low index layer 23, the dopant can be present in addition to the materials of these layers. In such embodiments, the dopant can have a concentration of about 0.0001 atomic % to about 1 atomic %, as deposited, in the high index layer 21 and the low index layer 23.

The thicknesses of the high index layer 21 and the low index layer 23 can be varied according to the materials in the layers 21, 23 and the components of the window film stack. In most embodiments, the thickness of each of the high index layer 21 and the low index layer 23 can be about 5 nm to about 60 nm (e.g., about 10 nm to about 50 nm). In one particular embodiment, the high index layer 21 can be a titanium oxide layer having a thickness of about 10 nm to about 15 nm (e.g., about 11 nm to about 12 nm, such as about 11.5 nm), and the low index layer 23 can be a silicon dioxide layer having a thickness of about 30 nm to about 33 nm (e.g., about 31 nm to about 32 nm, such as about 31.5 nm). In an alternative embodiment, the high index layer 21 can be a ZTO layer having a thickness of about 20 nm to about 27 nm (e.g., about 22 nm to about 26 nm), and the low index layer 23 can be a silicon dioxide layer having a thickness of about 20 nm to about 30 nm (e.g., about 26 nm to about 28 nm, such as about 27 nm).

Although shown with the high index layer 21 adjacent to and directly on the glass substrate 12 followed by the low index layer 23 adjacent to and directly on the high index layer 21, other configurations may be utilized. For example, the low index layer 23 can be adjacent to and directly on the glass substrate 12 followed by the high index layer 21 being adjacent to and directly on the low index layer 23. Additionally, multiple high index layers and low index layers can be present between the pair of index matching layers 21, 23 and the TCO layer 14, arranged such that the high indexing layers and low indexing layers are in alternating orientation.

As stated, the exemplary devices 10 of FIGS. 1-4 include a transparent substrate 12 employed as the substrate. In these embodiments, the transparent substrate 12 can be referred to as a "superstrate", as it is the substrate on which the subsequent layers are formed even though it faces upward to the radiation source (e.g., the sun) when the photovoltaic device 10 is in used. The top sheet of transparent substrate 12 can be, in particular embodiments, a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the transparent substrate 12 can be a low iron float glass containing less than about 0.15% by weight iron (Fe), and may have a transmissiveness of about 0.9 or greater in the spectrum of interest (e.g., wavelengths from about 300 nm to about 900 nm).

The TCO layer 14 and the oxygen getter layer(s) (e.g., the top oxygen getter layer 13 and/or the bottom oxygen getter layer 15) are deposited on the transparent substrate 12 as discussed above.

A resistive transparent buffer layer 16 (RTB layer) is shown on the TCO layer 14 on the exemplary photovoltaic devices 10, either directly on the TCO layer 14 as shown in FIG. 2 or with a bottom oxygen getter layer 15 therebetween as shown in FIGS. 1 and 3. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.5 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 20. Thus, it is believed that the RTB layer 16 allows for improved adhesion and/or interaction between the TCO layer 14 and the cadmium telluride layer 20, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spray-pyrolysis, or any other suitable deposition method. In one particular embodiment, the RTB layer 16 can be formed by sputtering (e.g., DC sputtering or RF sputtering) on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

For example, in embodiments where the dopant is included within the RTB layer 16, the dopant can be present in addition to the materials of these layers. In such embodiments, the dopant can have a concentration of about 0.0001 atomic % to about 0.1 atomic %, as deposited, in the RTB layer 16.

In certain embodiments, the RTB layer 16 can have a thickness between about 0.075 µm and about 1 µm, for example from about 0.1 µm to about 0.5 µm. In particular embodiments, the RTB layer 16 can have a thickness between about 0.08 µm and about 0.2 µm, for example from about 0.1 µm to about 0.15 µm.

A cadmium sulfide layer 18 is shown on RTB layer 16 of the exemplary device 10. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering (e.g., direct current (DC) sputtering or radio frequency (RF) sputtering) on the RTB layer 16. Sputtering deposition generally involves ejecting material from a target, which is the material source, and depositing the ejected material onto the substrate to form the film. DC sputtering generally involves applying a current to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. The current applied to the source material can vary depending on the size of the source material, size of the sputtering chamber, amount of surface area of substrate, and other variables. In some embodiments, the current applied can be from about 2 amps to about 20 amps. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the RTB layer 16, the cadmium sulfide layer 18 can have a thickness that is less than about 0.1 µm, such as between about 10 nm and about 100 nm, such as from about 50 nm to about 80 nm, with a minimal presence of pinholes between the TCO layer 14 and the cadmium sulfide layer 18. Additionally, a cadmium sulfide layer 18 having a thickness less than about 0.1 µm reduces any absorption of radiation energy by the cadmium sulfide layer 18, effectively increasing the amount of radiation energy reaching the underlying cadmium telluride layer 20.

A cadmium telluride layer 20 is shown on the cadmium sulfide layer 18 in the exemplary devices 10. The cadmium telluride layer 20 is a p-type layer that generally includes cadmium telluride (CdTe) but may also include other materials. As the p-type layer of device 10, the cadmium telluride layer 20 is the photovoltaic layer that interacts with the cadmium sulfide layer 18 (i.e., the n-type layer) to produce current from the adsorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 1.5 µm and about 4 µm, such as about 2 µm to about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 425° C.) for a sufficient time (e.g., from about 1 to about 40 minutes) to create a quality p-type layer of cadmium telluride. Without wishing to be bound by theory, it is believed that annealing the cadmium telluride layer 20 (and the device 10) decreases the deep-defect density and makes the CdTe layer more p-type. Additionally, the cadmium telluride layer 20 can recrystallize and undergo grain regrowth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22 and/or can create a Cu-doped CdTe layer. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 250° C.) for about 5 minutes to about 30 minutes, such as from about 10 to about 25 minutes.

However, in one embodiment, no additional treatments may be required to add copper to the cadmium telluride layer 20, particularly if the dopant included in the window layer(s) is copper.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, silver, or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 μm to about 10 μm in thickness, for example from about 1 μm to about 5 μm. A metal layer of the back contact, if used for or as part of the back contact layer 22, can be from about 0.1 μm to about 1.5 μm in thickness.

The encapsulating glass 24 is also shown in the exemplary cadmium telluride thin film photovoltaic device 10 of FIG. 1.

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 5:
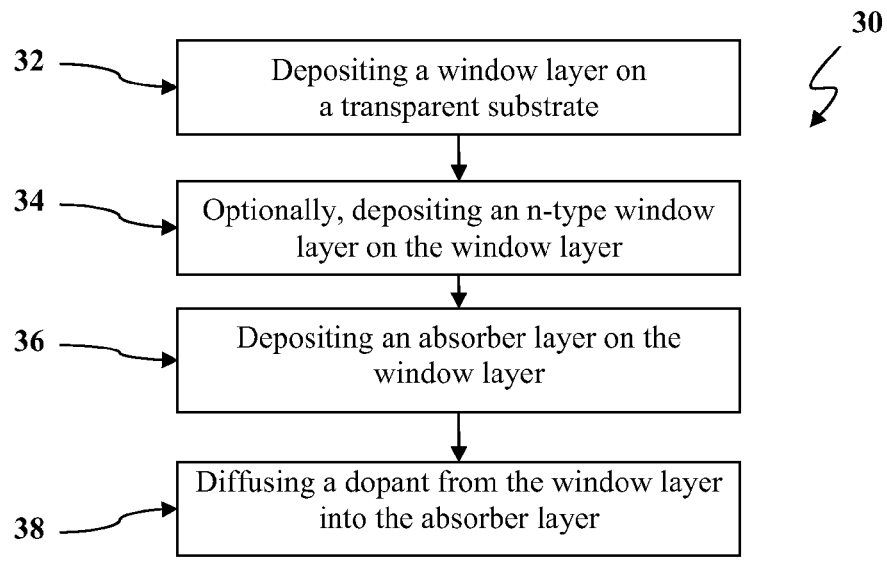
FIG. 5 shows a flow diagram of an exemplary method of manufacturing a thin film photovoltaic device.

FIG. 5 shows a flow diagram of an exemplary method 30 of manufacturing a photovoltaic device according to one embodiment of the present invention. According to the exemplary method 30, a window layer is deposited on a transparent superstrate at 32, and an n-type window layer (e.g., a cadmium sulfide layer) is optionally deposited on the window layer at 34. An absorber layer (e.g., a cadmium telluride layer) is deposited on the window layer, and the n-type window layer when present, at 36. A dopant is then diffused from the window layer into the absorber layer at 38. As discussed above, the window layer can define any of an index matching layer(s), a transparent conductive oxide layer, a getter layer (e.g., an oxygen getter layer), a resistive transparent buffer layer, or combinations thereof.

One of ordinary skill in the art should recognize that other processing and/or treatments can be included in the method 30. For instance, when including a cadmium sulfide layer and a cadmium telluride layer, the cadmium telluride layer can be annealed in the presence of cadmium chloride, and washed to remove any CdO formed on the surface. Back contact layer(s) can be applied over the cadmium telluride layer, and an encapsulating substrate can be applied over the back contact layer. Additionally, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

Figure 6:
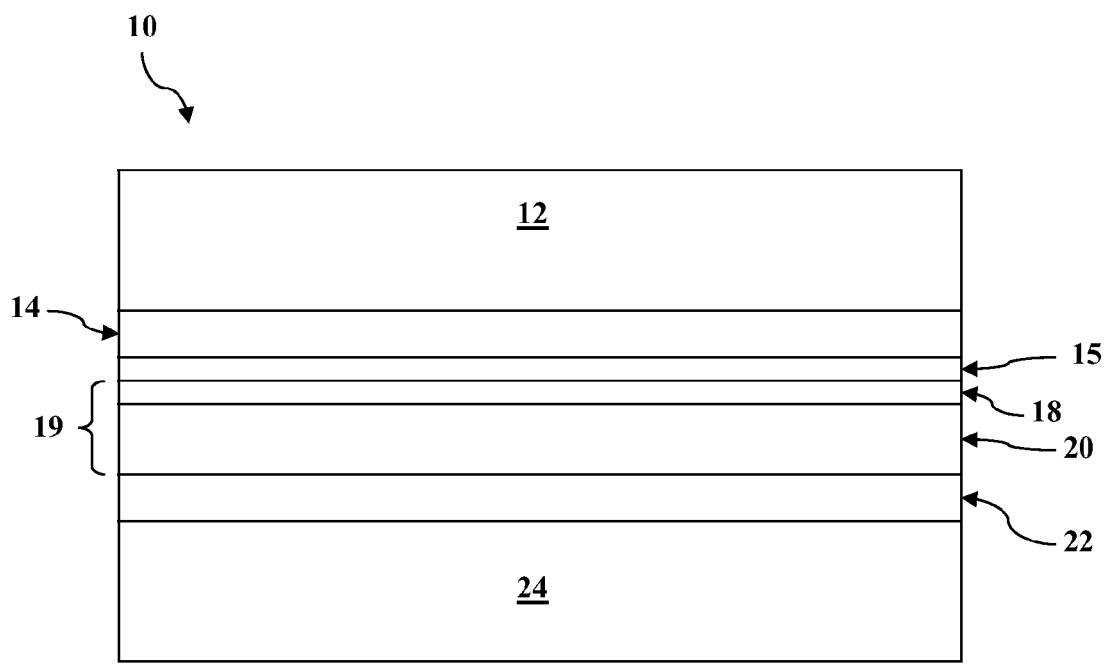
FIG. 6 shows another embodiment of the device, where the oxygen getter layer can act as a resistive transparent buffer layer; and, FIG. 7 shows yet another embodiment of the device, where the oxygen getter layer can act as an index matching layer.

FIG. 6 shows another embodiment of the device 10, where the bottom oxygen getter layer 15 is formed from a material that, upon oxidation after annealing, can act as a resistive transparent buffer layer. As such, a separate RTB layer may be omitted from the device 10, leaving only the bottom oxygen getter layer 15 between the TCO layer 14 and the cadmium sulfide layer 18, or at least may allow for a thinner RTB layer to be formed therebetween than would otherwise had been used but for the presence of the oxygen getter layer 15. For example, the bottom oxygen getter layer 15 can be deposited to include zinc and/or tin (e.g., a zinc-tin alloy) and can be oxidized upon annealing to form a zinc-tin oxide layer ("ZTO"), such as described above with respect to the RTB layer. In this embodiment, the bottom oxygen getter layer 15 and/or the TCO layer 14 can include the dopant that is diffused into the absorber layer 20.

Figure 7:
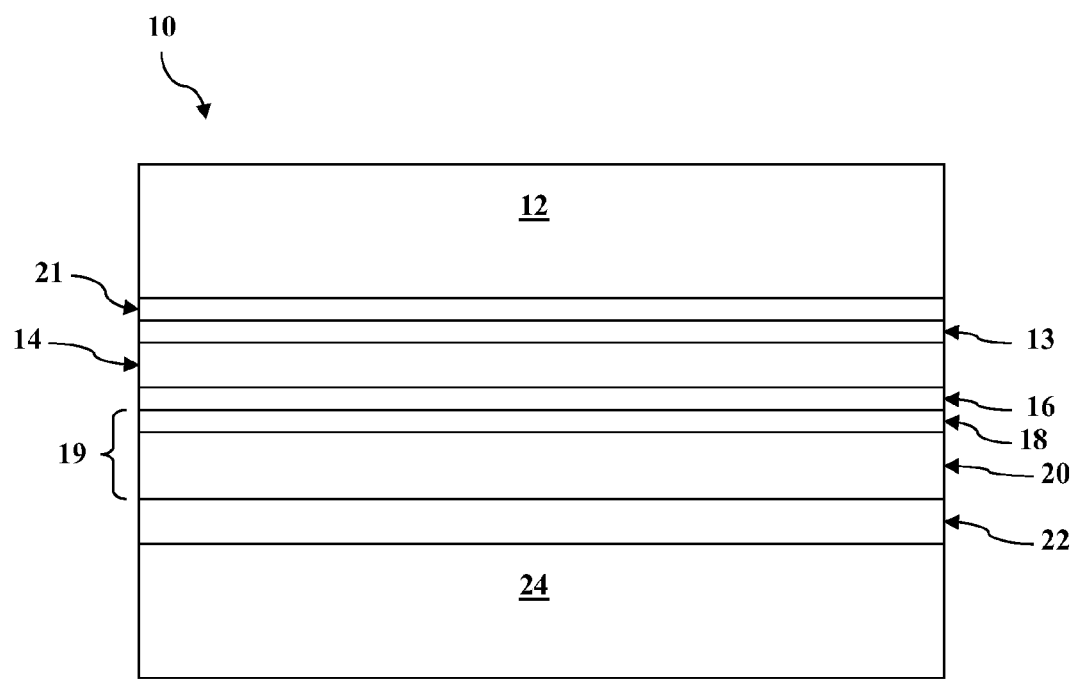

FIG. 7 shows yet another embodiment of the device 10, where the top oxygen getter layer 13 is formed from a material that, upon oxidation after annealing, can act as an index matching layer, in conjunction with another index layer (e.g., shown as a high index layer 21). As such, a separate low index layer may be omitted from the device 10, leaving only the top oxygen getter layer 13 between the high index matching layer 21 and the TCO layer 14, or at least may allow for a thinner additional index matching layer to be formed therebetween than would otherwise had been used but for the presence of the oxygen getter layer 13. For example, the top oxygen getter layer 13 can be deposited to include aluminum and can be oxidized upon annealing to form an aluminum oxide layer that acts as an index matching layer in the device 10. In this embodiment, the high index matching layer 21, the top oxygen getter layer 13, TCO layer 14, and/or the RTB layer 16 can include the dopant that is diffused into the absorber layer 20.

As indicated from the description of FIGS. 6 and 7, it can be seen that a oxygen getter layer 13 and/or 15 can, in the broadest sense, be chosen so as to serve oxygen getter during anneal and processing of the TCO layer (and, in some embodiments, providing a dopant for diffusion into the absorber layer), while serving a separate long-term role in the finished device 10.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of doping an absorbent layer in a thin film photovoltaic device, the method comprising:
    depositing a window layer on a transparent substrate, wherein the window layer comprises a dopant;
    forming a p-n heterojunction on the window layer, wherein the p-n heterojunction comprises an absorber layer, and wherein the absorber layer comprises a photovoltaic material; wherein the p-n heterojunction further comprises an n-type window layer positioned between the window layer and the absorber layer; and,
    diffusing the dopant from the window layer into the absorber layer.

2. The method of claim 1, wherein the dopant comprises copper.

3. The method of claim 1, wherein the dopant is diffused into the absorber layer such that the dopant is present in the absorber layer at about 100 ppm to about 1 atomic percent.

4. The method of claim 1, wherein the photovoltaic material comprises cadmium telluride.

5. The method of claim 1, wherein the n-type window layer comprises cadmium sulfide.

6. The method of claim 1, wherein the window layer defines a resistive transparent buffer layer positioned between a transparent conductive oxide layer and the n-type window layer.

7. The method of claim 6, wherein the window layer comprises a zinc tin oxide.

8. The method of claim 1, wherein window layer defines a transparent conductive oxide layer.

9. The method of claim 8, further comprising:
depositing a resistive transparent buffer layer on the window layer prior to forming the p-n heterojunction such that the resistive transparent buffer layer is positioned between the window layer and the p-n heterojunction.

10. The method of claim 1, wherein the window layer defines a getter layer.

11. The method of claim 10, further comprising:
depositing a transparent conductive oxide layer on the transparent substrate to be adjacent to the getter layer.

12. The method of claim 11, wherein the transparent conductive oxide layer is formed on the substrate prior to depositing the window layer such that the transparent conductive oxide layer is positioned between the window layer and the p-n heterojunction.

13. The method of claim 1, wherein the absorber layer is substantially free from the dopant prior to diffusing.

14. The method of claim 1, wherein diffusing the dopant from the window layer into the absorber layer comprises annealing the absorber layer and the window layer together.

15. The method of claim 14, wherein annealing comprises heating to an anneal temperature of about 300° C. to about 500° C.

16. A method of doping an absorbent layer in a thin film photovoltaic device the method comprising:
depositing a window layer on a transparent substrate, wherein the window layer comprises a dopant;
forming a p-n heterojunction on the window layer, wherein the p-n heterojunction comprises an absorber layer, and wherein the absorber layer comprises a photovoltaic material; and,
diffusing the dopant from the window layer into the absorber layer;
wherein the window layer is deposited via sputtering of a target, wherein the target comprises the dopant.

17. The method of claim 16, wherein the target further comprises a cadmium tin oxide such that the window layer defines a transparent conductive oxide layer that includes the dopant.

18. The method of claim 16, wherein the target further comprises a zinc tin oxide such that the window layer defines a resistive transparent buffer layer that includes the dopant.

19. The method of claim 16, wherein the target further comprises a metal such that the window layer defines a getter layer that includes the dopant.

* * * * *